(12) United States Patent
Nambu

(10) Patent No.: US 12,019,132 B2
(45) Date of Patent: Jun. 25, 2024

(54) MAGNETIC RESONANCE IMAGING APPARATUS, IMAGE GENERATION METHOD, AND COMPUTER-READABLE NONVOLATILE STORAGE MEDIUM STORING IMAGE GENERATION PROGRAM

(71) Applicant: CANON MEDICAL SYSTEMS CORPORATION, Otawara (JP)

(72) Inventor: Masahito Nambu, Utsunomiya (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 100 days.

(21) Appl. No.: 17/935,764

(22) Filed: Sep. 27, 2022

(65) Prior Publication Data

US 2023/0099712 A1    Mar. 30, 2023

(30) Foreign Application Priority Data

Sep. 29, 2021  (JP) .................................. 2021-158710

(51) Int. Cl.
*G01R 33/56*    (2006.01)
*G01R 33/385*   (2006.01)
*G06T 11/00*    (2006.01)

(52) U.S. Cl.
CPC .......... *G01R 33/56* (2013.01); *G01R 33/385* (2013.01); *G06T 11/005* (2013.01); *G06T 11/006* (2013.01); *G06T 11/008* (2013.01)

(58) Field of Classification Search
CPC .............................. G01R 33/56; G01R 33/385
See application file for complete search history.

(56) References Cited

U.S. PATENT DOCUMENTS

| 8,717,020 | B2* | 5/2014 | Griswold | A61B 5/055 |
| | | | | 324/309 |
| 10,247,802 | B2* | 4/2019 | Wang | G01R 33/5659 |
| 2013/0285655 | A1 | 10/2013 | Miyazaki et al. | |
| 2013/0285662 | A1 | 10/2013 | Takeshima | |
| 2020/0249302 | A1* | 8/2020 | Van Den Brink | G01R 33/583 |

FOREIGN PATENT DOCUMENTS

JP    2013-240571 A    12/2013

* cited by examiner

*Primary Examiner* — Gregory H Curran
(74) *Attorney, Agent, or Firm* — Oblon, McClelland, Maier & Neustadt, L.L.P.

(57) ABSTRACT

A magnetic resonance imaging apparatus includes processing circuitry. The processing circuitry is configured to acquire a first coil sensitivity map and a second coil sensitivity map for a plurality of coils, the second coil sensitivity map being different in phase from the first coil sensitivity map; generate a first image based on the first coil sensitivity map and magnetic resonance data related to the plurality of coils; generate a second image based on the first coil sensitivity map, the second coil sensitivity map, and the first image; and generate a final image from the first image and the second image.

10 Claims, 15 Drawing Sheets

DA9

DA10

MAGNETIC RESONANCE IMAGING APPARATUS, IMAGE GENERATION METHOD, AND COMPUTER-READABLE NONVOLATILE STORAGE MEDIUM STORING IMAGE GENERATION PROGRAM

CROSS-REFERENCE TO RELATED APPLICATION

This application is based upon and claims the benefit of priority from Japanese Patent Application No. 2021-158710, filed on Sep. 29, 2021; the entire contents of which are incorporated herein by reference.

FIELD

Embodiments described herein relate generally to a magnetic resonance imaging apparatus, an image generation method, and a computer-readable nonvolatile storage medium storing an image generation program.

BACKGROUND

A magnetic resonance imaging (hereinafter, MRI) apparatus may acquire data in an undersampled manner for the purpose of shortening a length of imaging time. In addition, the MRI apparatus may estimate a coil sensitivity map from the undersampled data to reconstruct an image based on the estimated coil sensitivity map. In such a case the reconstructed image may contain non-smoothly phase-changing portion or portions.

Because of this, when interpolating such a reconstructed image based on the estimated coil sensitivity map, artifacts may occur in a largely phase changing portion IN the interpolated image.

DETAILED DESCRIPTION

According to an embodiment, a magnetic resonance imaging apparatus includes processing circuitry. The processing circuitry is configured to acquire a first coil sensitivity map and a second coil sensitivity map for a plurality of coils, the second coil sensitivity map being different in phase from the first coil sensitivity map; generate a first image based on the first coil sensitivity map and magnetic resonance data related to the plurality of coils; generate a second image based on the first coil sensitivity map, the second coil sensitivity map, and the first image; and generate a final image from the first image and the second image.

Hereinafter, exemplary embodiments of a magnetic resonance imaging (MRI) apparatus, an image generation method, and an image generation program will be described in detail with reference to the accompanying drawings. The technical ideas of embodiments described herein may be applied to various multifunction MRI modalities such as a positron emission tomography (PET)-MRI apparatus and a single photon emission computed tomography (SPECT)-MRI apparatus.

First Embodiment

Figure 1:
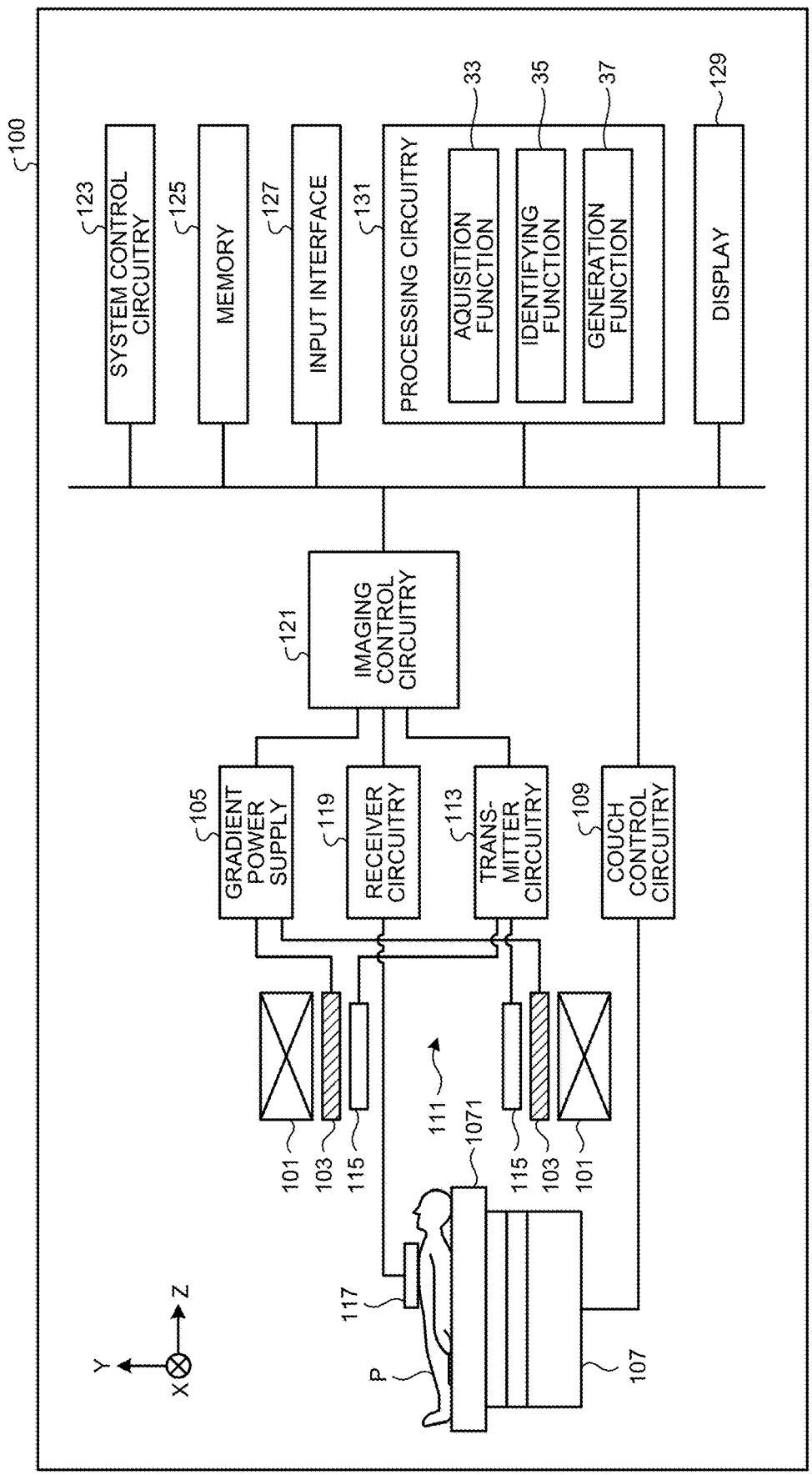
FIG. 1 is a schematic block diagram illustrating an exemplary magnetic resonance imaging apparatus according to an embodiment.

FIG. 1 illustrates an exemplary MRI apparatus 100 according to an embodiment. As illustrated in FIG. 1, the MRI apparatus 100 includes magnetostatic magnets 101, gradient coils 103, a gradient power supply 105, a couch 107, couch control circuitry 109, transmitter circuitry 113, a transmitter coil 115, a receiver coil 117, receiver circuitry 119, imaging control circuitry (imaging control unit) 121, system control circuitry (system control unit) 123, a memory 125, an input interface 127, a display 129, and processing circuitry 131.

The magnetostatic magnets 101 are hollow, substantially cylindrical magnets. The magnetostatic magnets 101 substantially evenly generate magnetostatic fields in the internal space. Examples of the magnetostatic magnets 101 include a superconductive magnet.

The gradient coils 103 are hollow, substantially cylindrical coils and placed inside a cylindrical cooling container. The gradient coils 103 are individually supplied with currents to generate gradient magnetic fields which vary in magnetic strength along mutually orthogonal axes X, Y, and Z. The X, Y, and Z-axial gradient magnetic fields generated by the gradient coils 103 serve as, for example, a slice-selection gradient magnetic field, a phase-encoding gradient magnetic field, and a frequency-encoding gradient magnetic field. The slice-selection gradient magnetic field is used for optionally determining an imaging view. The phase-encoding gradient magnetic field is used for changing a magnetic resonance signal (hereinafter, MR signal) in phase in accordance with a spatial position. The frequency-encoding gradient magnetic field is used for varying the MR signal in frequency in accordance with a spatial position.

The gradient power supply 105 is a power supply unit that supplies currents to the gradient coils 103 under the control of the imaging control circuitry 121.

The couch 107 includes a tabletop 1071 on which a subject P is to be laid. Under the control of the couch control circuitry 109, the tabletop 1071 on which the subject P is lying is inserted into a bore 111.

The couch control circuitry 109 serves to control the couch 107. The couch control circuitry 109 drives the couch 107 in response to an operator's instruction given via the input interface 127 to move the tabletop 1071 longitudinally and vertically, and horizontally in some situation.

The transmitter circuitry 113 serves to supply high frequency pulses modified with the Larmor frequency to the transmitter coil 115 under the control of the imaging control circuitry 121. The transmitter circuitry 113 includes, for example, an oscillator, a phase selector, a frequency converter, an amplitude modifier, and a radio frequency (RF) amplifier. The oscillator generates RF pulses at a resonance frequency specific to target atomic nuclei in the magnetostatic field. The phase selector selects the phase of the RF pulses generated by the oscillator. The frequency converter converts the frequency of the RF pulses output from the phase selector. The amplitude modifier modifies the frequency of the RF pulses output from the frequency converter by, for example, a sinc function. The RF amplifier amplifies the RF pulses output from the amplitude modifier for supply to the transmitter coils 115.

The transmitter coils 115 are RF coils located inside the gradient coils 103. The transmitter coils 115 generate RF pulses which correspond to a high-frequency magnetic field, in accordance with an output from the transmitter circuitry 113.

The receiver coil 117 is an RF coil located inside the gradient coils 103. The receiver coil 117 receives MR signals radiated from the subject P due to a high frequency magnetic field. The receiver coil 117 outputs the MR signals to the receiver circuitry 119 upon receipt. The receiver coil 117 is, for example, a coil array including one or more, or typically two or more coil elements (hereinafter, referred to as multiple coils). In the following, the receiver coil 117 is defined as a coil array including two or more coils for the sake of concrete explanation.

Although the transmitter coils 115 and the receiver coil 117 are depicted as independent RF coils in FIG. 1, the transmitter coil 115 and the receiver coil 117 may be integrated into a transmitter and receiver coil. The transmitter and receiver coil is, for example, a local transmitter and receiver RF coil adapted to a region of the subject P to be imaged, such as a head coil.

The receiver circuitry 119 serves to generate digital MR signals (hereinafter, MR data) from the MR signals output from the receiver coil 117 under the control of the imaging control circuitry 121. Specifically, a receiver circuitry 110 subjects the MR signals output from the receiver coil 117 to signal processing including detection and filtering, and then performs analog to digital (A/D) conversion to the resultant MR signals to generate MR data. The receiver circuitry 110 transmits the MR data to the imaging control circuitry 121. For example, the MR data is generated in each of the multiple coils and output to the imaging control circuitry 121 together with identification tags for the respective coils.

The imaging control circuitry 121 serves to control the gradient power supply 105, the transmitter circuitry 113, and the receiver circuitry 119 in accordance with an imaging protocol output from the processing circuitry 131, to image the subject P. The imaging protocol includes a pulse sequence depending on an examination type. The imaging protocol defines a magnitude of current to be supplied from the gradient power supply 105 to the gradient coils 103, current supply timing from the gradient power supply 105 to the gradient coils 103, a magnitude and period of a high frequency pulse to be supplied from the transmitter circuitry 113 to the transmitter coil 115, high-frequency pulse supply timing from the transmitter circuitry 113 to the transmitter coil 115, and timing at which the receiver coil 117 receives the MR signals, for example. The imaging control circuitry 121 drives the gradient power supply 105, the transmitter circuitry 113, and the receiver circuitry 119 to image the subject P, receives resultant MR data from the receiver circuitry 119, and transfers the MR data to the processing circuitry 131.

The imaging control circuitry 121 scans and images the subject P using a pulse sequence for undersampled data acquisition (hereinafter, undersampling imaging), for example, to acquire MR data. In the following, scanning of the subject P is defined as parallel imaging including an imaging protocol for acquiring MR signals related to a trajectory corresponding to an auto-calibrated signal (hereinafter, ACS) in k-space for the sake of concrete explanation. Such an imaging protocol is referred to as an ACS protocol. In the present embodiment, scanning-related parallel imaging includes, for example, an imaging protocol similar to generalized auto-calibrating partially parallel acquisitions (GRAPPA).

In the parallel imaging, the trajectory corresponding to the ACS is not limited to near the center of k-space as in GRAPPA and is freely settable. Further, scanning of the subject P is not limited to the above-described parallel imaging but may be implemented by an imaging protocol similar to compressed sensing as long as the protocol includes the ACS protocol. Alternatively, scanning of the subject P may be implemented by an imaging protocol being a combination of compressed sensing and parallel imaging as long as the protocol includes the ACS protocol.

The MR data, as acquired by parallel imaging in the individual coils, contains ACS and data that is acquired in k-space at a reduction factor R (also referred to as acceleration factor) without phase encoding. The reduction factor R is predefined according to a user's instruction, for example. The ACS includes target data at a target point associated with a data undersampling position as well as source data at a source point adjacent to the target point.

In addition the imaging control circuitry 121 may acquire, by any suitable imaging method, MR data related to generation of images that represent a sensitivity distribution of the receiver coil 117 to be used in imaging the subject P. The images representing coil sensitivities are represented by complex data. Prior to scanning the subject P, the imaging control circuitry 121 acquires the MR data related to generation of images representing a sensitivity distribution of the receiver coil 117 by a pre-scan including a locator scan, for example. The imaging control circuitry 121 may be implemented by, for example, a processor.

The term "processor" used herein signifies, for example, circuitry such as a CPU, a graphical processing unit (GPU), an application specific integrated circuit (ASIC), a programmable logic device (e.g., simple programmable logic device (SPLD)), a complex programmable logic device (CPLD), and a field programmable gate array (FPGA).

The system control circuitry 123 includes hardware resources such as a processor and a memory as read-only memory (ROM) or random access memory (RAM) (not illustrated), and includes a system control function to control the MRI apparatus 100. Specifically, the system control circuitry 123 reads and loads a system control program from the memory onto the memory to control the respective circuits of the MRI apparatus 100 by the system control program.

As an example, the system control circuitry 123 reads an imaging protocol from the memory 125 under an imaging condition input by the operator via the input interface 127. The system control circuitry 123 transmits the imaging protocol to the imaging control circuitry 121 to control imaging of the subject P. The system control circuitry 123 may be implemented by, for example, a processor. Alternatively, the system control circuitry 123 may be incorporated into the processing circuitry 131. In this case the processing circuitry 131 implements the system control function and functions as a substitute for the system control circuitry 123. The processor for implementing the system control circuitry 123 is similar to the one described above, therefore, a description thereof is omitted.

The memory 125 stores therein various kinds of data such as various programs related to the system control function to be implemented by the system control circuitry 123, various imaging protocols, imaging conditions including various imaging parameters that define the imaging protocols, and else. The memory 125 further stores therein an acquisition function 33, an identifying function 35, and a generation function 37 to be implemented by the processing circuitry 131 in computer-executable program format.

The memory 125 further stores therein various kinds of data acquired by the acquisition function 33, various kinds of data to be used in processing by the identifying function 35 and the generation function 37, MR images generated by the generation function 37, and various kinds of data generated during the MR image generation. The various kinds of data stored in the memory 125 will be described later. The memory 125 further stores therein MR data obtained by scanning the subject P and algorithms for reconstructing MR images from the MR data.

Additionally, the memory 125 may store various kinds of data received via a communication interface (not illustrated). As an example, the memory 125 may store examination order information as to the subject P (e.g., a region to be imaged, a purpose of examination) which is received from an information processing system installed in a medical institution, such as a radiology information system (RIS).

The memory 125 can be implemented by, for example, a semiconductor memory device such as ROM, RAM, or flash memory, a hard disk drive (HDD), a solid state drive (SSD), or an optical disk. The memory 125 may be implemented by a drive system that reads and writes various kinds of information from and to a portable storage medium such as a compact disc (CD)-ROM drive, a digital versatile disk (DVD) drive, or flash memory, for example.

The input interface 127 serves to receive various instructions (e.g., power-on instruction) and information inputs from the operator. The input interface 127 can be, for example, implemented by a trackball, a switch button, a mouse, a keyboard, a touch pad that receives inputs by touch on the operational surface, a touch screen being an integration of a touch pad and a display screen, non-contact input circuitry including an optical sensor, or audio input circuitry. The input interface 127 is connected to the processing circuitry 131, and converts operational inputs from the operator into electric signals to output the signals to the processing circuitry 131. In this disclosure the input interface 127 is not limited to the one including physical operation component or components such as a mouse or a keyboard. Examples of the input interface 127 includes electric-signal processing circuitry that receives an electric signal corresponding to an input from an external input device independent from the MRI apparatus 100 and outputs the electric signal to control circuitry.

In response to a user's instruction, the input interface 127 inputs a field of view (FOV) to a pre-scan image displayed on the display 129. Specifically, in accordance with a user's instruction to set a range, the input interface 127 inputs a FOV to a locator image displayed on the display 129. The input interface 127 inputs various imaging parameters for scanning, in response to a user's instruction based on an examination order.

The display 129 serves to display, under the control of the processing circuitry 131 or the system control circuitry 123, a variety of graphical user interfaces (GUI), MR images generated by the processing circuitry 131, and final images generated by the generation function 37, for example. The display 129 further displays the imaging parameters for scanning and various kinds of image processing information. The display 129 can be, for example, implemented by a CRT display, a liquid display, an organic EL display, an LED display, a plasma display, any other display known in related art, or a display device as a monitor.

The processing circuitry 131 can be, for example, implemented by the processor as described above. The processing circuitry 131 includes the acquisition function 33, the identifying function 35, and the generation function 37. The processing circuitry 131 that implements the acquisition function 33, the identifying function 35, and the generation function 37 correspond to an acquirer unit, an identifying unit, and a generator unit, respectively. The acquisition function 33, the identifying function 35, and the generation function 37 are stored in computer-executable program format in the memory 125. For example, the processing circuitry 131 implements the functions by reading and executing the corresponding programs from the memory 125. In other words, the processing circuitry 131 can obtain the acquisition function 33, the identifying function 35, and the generation function 37 after reading the corresponding programs.

In the above description, the processor reads and executes the programs corresponding to the respective functions from the memory 125 by way of example. However, the embodiments are not limited to such an example. When the processor is a CPU, for example, the processor implements the functions by reading and executing the programs from the memory 125. Meanwhile, when the processor is an ASIC, the programs are not stored in the memory 125 and the functions are directly embedded in the circuitry of the processor as a logic circuit instead. According to the present embodiment, each processor may be configured as a single circuit, or multiple independent circuits may be combined into a single processor to implement the functions. Further, in the above description the single memory circuit stores the programs corresponding to the processing functions by way of example. Alternatively, multiple memory circuits may be disposed in a distributed manner, allowing the processing circuitry 131 to read the corresponding programs from the individual memory circuits.

The processing circuitry 131 uses the acquisition function 33 to acquire a first coil sensitivity map with respect to the multiple coils. Specifically, the acquisition function 33 estimates a sensitivity map for each of the coils included in the receiver coil 117 from MR data obtained by each of the coils.

More specifically, the acquisition function 33 estimates the sensitivity maps for the respective coils by, for example, ESPIRiT (described in Uecker M, Lai P, Murphy M J, et al., "ESPIRiT-An Eigenvalue Approach to Autocalibrating Parallel MRI: where SENSE Meets GRAPPA", Magnetic Resonance in Medicine 71: 990-1001, March 2014) using the ACS in the MR data. Thereby, the acquisition function 33 estimates a sensitivity map (hereinafter, referred to as estimation sensitivity map) for each of the coils from undersampled data. The estimation sensitivity maps include intensity images representing sensitivity distributions of the multiple coils in gray value and phase images associated with the intensity images. The sensitivity map estimation method is not limited to the ESPIRiT and various existing approaches are applicable.

The processing circuitry 131 then uses the acquisition function 33 to shift the multi-coil estimation sensitivity maps in phase, with reference to a phase image of a coil as identified from among the multiple coils by the identifying function 35 (hereinafter, referred to as a first identified coil) in the estimation sensitivity map. In this manner the acquisition function 33 acquires the first coil sensitivity map for the multiple coils. The first coil sensitivity map includes phase images shifted in phase from the phase images of the coils other than the first identified coil in the estimation sensitivity maps so that the phase image of the first identified coil (hereinafter, referred to as first identified phase image) in the estimation sensitivity map can be uniform in phase. In other words, the intensity images representing multi-coil sensitivities in gray value in the first coil sensitivity map are similar to the intensity images in the estimation sensitivity maps while the phase images corresponding to the intensity images in the first coil sensitivity map are equivalent to the phase images shifted in phase from the phase images in the estimation sensitivity maps so as to allow the first identified phase image to be uniform in phase. The identifying function 35's identifying the first identified coil will be described later.

The processing circuitry 131 uses the acquisition function 33 to acquire a second coil sensitivity map for the multiple coils. The second coil sensitivity map differs in phase from the first coil sensitivity map. Specifically, the acquisition function 33 shifts the phase images of the multiple coils in phase in the estimation sensitivity maps, with reference to a phase image of another coil different from the first identified coil (hereinafter, second identified coil) identified by the identifying function 35 in the estimation sensitivity map. In this manner the acquisition function 33 acquires the second coil sensitivity map for all the coils. The identifying function 35's identifying the second identified coil will be described later. As described above, the acquisition function 33 shifts the phase images of the multi-coil sensitivities in phase with reference to the sensitivity of one of the multiple coils to thereby obtain the first coil sensitivity map and the second coil sensitivity map. Thus, the first coil sensitivity map and the second coil sensitivity map base on the different phase images. In other words, between the first coil sensitivity map and the second coil sensitivity map, the intensity images are the same but the phase images are different in phase value with respect to the respective coils.

The acquisition function 33 of the processing circuitry 131 may additionally acquire an odd number of coil sensitivity maps for the multiple coils. The odd number of coil sensitivity maps are different in phase from the first coil sensitivity map and the second coil sensitivity map. As an example, the acquisition function 33 shifts the phase images of the multiple coils in phase in the estimation sensitivity maps with reference to the phase image of another coil as identified by the identifying function 35 (hereinafter, referred to as a third identified coil) in the coil sensitivity estimate. Thereby, the acquisition function 33 acquires a third coil sensitivity map for all the coils. Subsequently, the acquisition function 33 acquires coil sensitivity maps for the rest of the coils in the same manner with reference to the coils identified in order by the identifying function 35. For example, when the number of the coils are eight, the acquisition function 33 may acquire eight coil sensitivity maps with reference to each of the eight coils.

The processing circuitry 131 uses the identifying function 35 to identify one coil to be a reference for the phase shift, based on the intensity images of the multiple coils in the multiple sensitivity maps (estimation sensitivity maps) or intensity images reconstructed from the MR data. Specifically, the identifying function 35 identifies two or more coils in descending order of the number of signal values (hereinafter, referred to as descending order of signal values) by, for example, singular value decomposition with respect to the intensity images in the estimation sensitivity maps (hereinafter, referred to as sensitivity-estimate intensity images) for the multiple coils. The descending order of signal values corresponds to descending order of magnitude of singular values. Known techniques such as coil compression are applicable as the singular value decomposition, therefore, a description thereof is omitted. The intensity images (contrast images) of the respective coils reconstructed from the MR data by the generation function 37 may be subjected to the singular value decomposition.

Specifically, the processing circuitry 131 uses the identifying function 35 to identify, as the first identified coil, a coil corresponding to a sensitivity-estimate intensity image having a largest number of signal values among all the sensitivity-estimate intensity images according to a result of the singular value decomposition. The identifying function 35 then identifies, as the second identified coil, a coil corresponding to a sensitivity-estimate intensity image having a second largest number of signal values among all the sensitivity-estimate intensity images. The identifying function 35 identifies, as the third identified coil, a coil corresponding to a sensitivity-estimate intensity image having a third largest number of signal values among all the sensitivity-estimate intensity images. Subsequently, the identifying function 35 identifies the other coils in the same manner.

The processing circuitry 131 uses the generation function 37 to generate a first image based on the first coil sensitivity map and the MR data related to the multiple coils. Specifically, the generation function 37 reconstructs images related to the individual coils (hereinafter, referred to as coil images) from the MR data related to the individual coils. The MR data is undersampled data acquired by undersampling imaging of the subject P, therefore, the coil images may contain wraparound artifacts. The generation function 37 generates a single first image with no wraparound artifacts by complex expansion based on the coil images and the first coil sensitivity map. The complex expansion can be any of known techniques such as a fast iterative shrinkage-thresholding algorithm (FISTA), therefore, a description thereof is omitted.

The processing circuitry 131 uses the generation function 37 to generate a second image based on the first coil sensitivity map, the second coil sensitivity map, and the first image. As an example, the generation function 37 decomposes the first image according to the first coil sensitivity map to generate decomposed images corresponding to the multiple coils. The decomposed images are MR images reflecting the sensitivities of the respective coils and containing no wraparound artifacts. Known techniques are applicable to the generation of the decomposed images from the first image, therefore, a description thereof is omitted. The generation function 37 generates the second image by combining the decomposed images corresponding to the multiple coils (hereinafter, referred to as coil combination) according to the second coil sensitivity map.

The processing circuitry 131 uses the generation function 37 to generate a final image from the first image and the second image. As an example, the generation function 37 performs an interpolation on the first image to generate a first interpolated image. The generation function 37 performs an interpolation on the second image to generate a second interpolated image. The interpolation refers to a process of implementing higher-resolution images (Zoom) by, for example, complex interpolation, and corresponds to a super resolution process. The super resolution process can be any of known techniques such as a linear interpolation among pixel values at neighboring pixels or zerofill in k-space, therefore, a description thereof is omitted.

The processing circuitry 131 uses the generation function 37 to generate a final image from the first interpolated image and the second interpolated image. Specifically, the generation function 37 of the processing circuitry 131 generates a final image by performing a statistical process on the first interpolated image and the second interpolated image. More specifically, the generation function 37 generates a final image by a statistical process including computing a mean of two pixel values at two corresponding pixels in the first interpolated image and the second interpolated image or selecting a larger value or a median between the two pixel values.

The acquisition function 33 may additionally acquire an odd number of coil sensitivity maps, different in phase from the first and second coil sensitivity maps, for the multiple coils. In such a case the processing circuitry 131 uses the generation function 37 to generate an odd number of images based on the odd number of coil sensitivity maps, the first coil sensitivity map, and the first image. The generation function 37 generates a final image from the first image, the second image, and the odd number of images by selecting a median among an odd number of pixel values at an odd number of corresponding pixels in the first image, the second image, and the odd number of images.

The image generation process of the MRI apparatus 100 of the present embodiment as structured above will be described referring to FIG. 2 to FIG. 18. The image generation process refers to a process of reducing artifacts arising from a steep change in phase to generate a super-resolution image as a final image, for example. In the following, the number of coils included in the receiver coil 117 is defined as eight, and the number of coils to be identified by the identifying function 35 is defined as three for the sake of concrete explanation.

Figure 2:
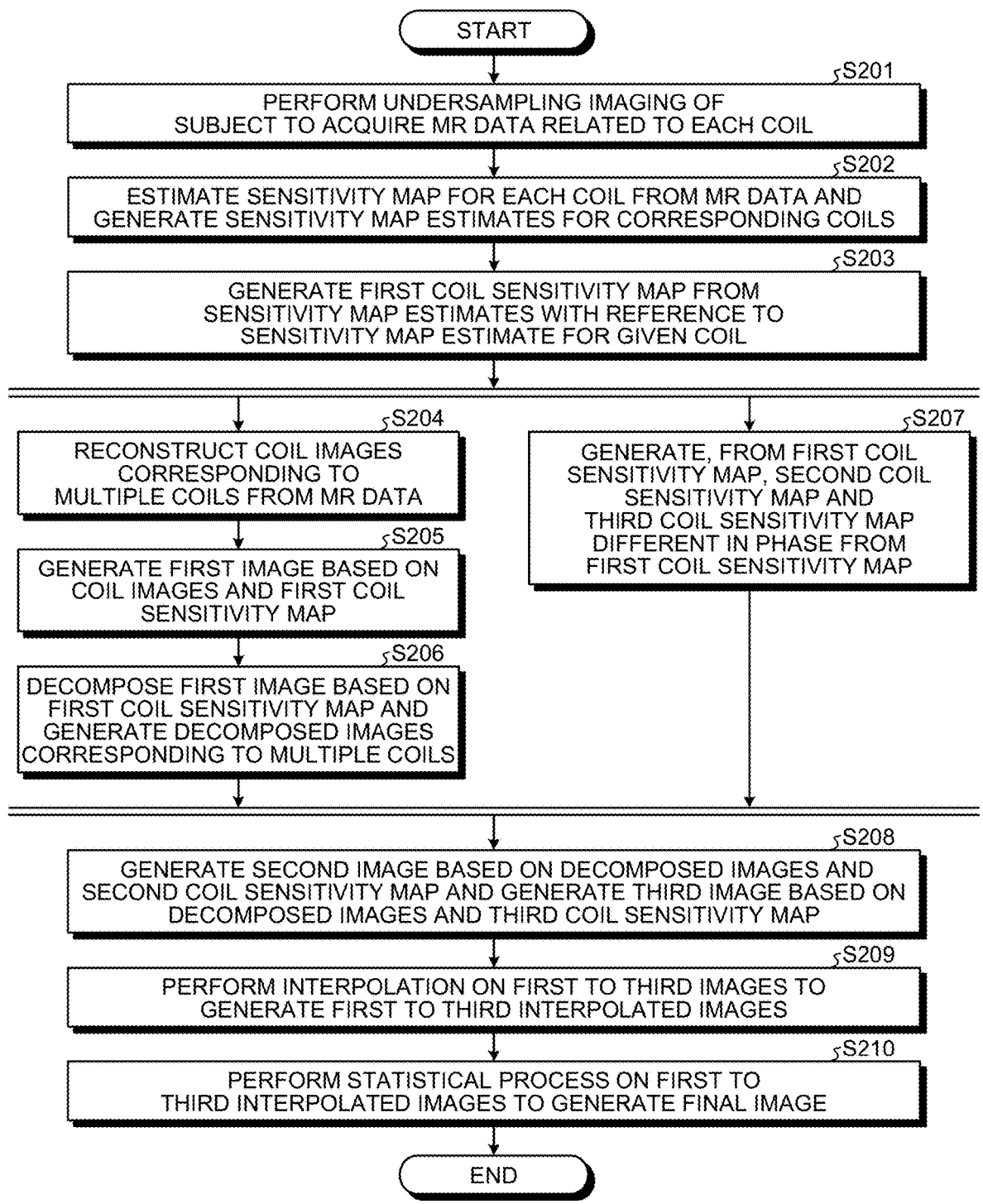
FIG. 2 is a flowchart illustrating an exemplary image generation process according to an embodiment.
Figure 3:
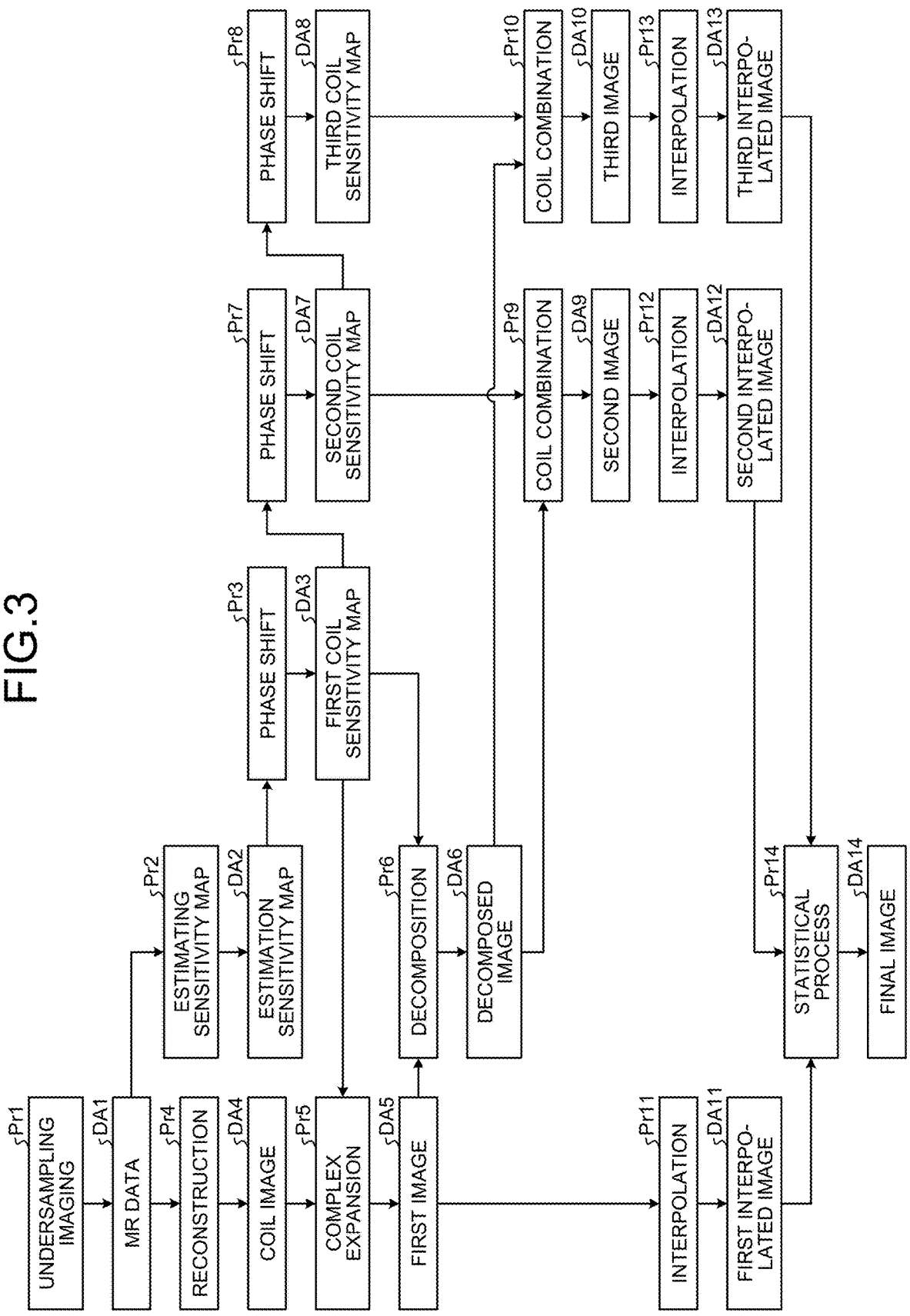
FIG. 3 is a chart illustrating an association between various operations in an image generation process and data related to the various operations according to an embodiment, by way of example.

FIG. 2 is a flowchart illustrating an exemplary image generation process. FIG. 3 is a chart illustrating an association between various operations in the image generation process and data related to the various operations, by way of example.

Image Generation Process

Step S201

The imaging control circuitry 121 performs imaging of the subject P in an undersampled manner (Pr1). This allows the acquisition function 33 of the processing circuitry 131 to acquire MR data DA1 related to each of the multiple coils.

Step S202

The processing circuitry 131 uses the acquisition function 33 to estimate a sensitivity map for each of the multiple coils from the undersampled MR data DA1 by ESPIRiT, for example (Pr2). The acquisition function 33 thus generates estimation sensitivity maps DA2 for the corresponding coils. The identifying function 35 then identifies three coils, i.e., the first identified coil, second identified coil, and third identified coil in descending order of signal values by a singular value decomposition with respect to sensitivity-estimate intensity images in the estimation sensitivity maps DA2. Alternatively, the identifying function 35 may identify three coils in descending order of signal values by a singular value decomposition with respect to coil images DA4. In this case, step S204 precedes step S203.

Figure 4:
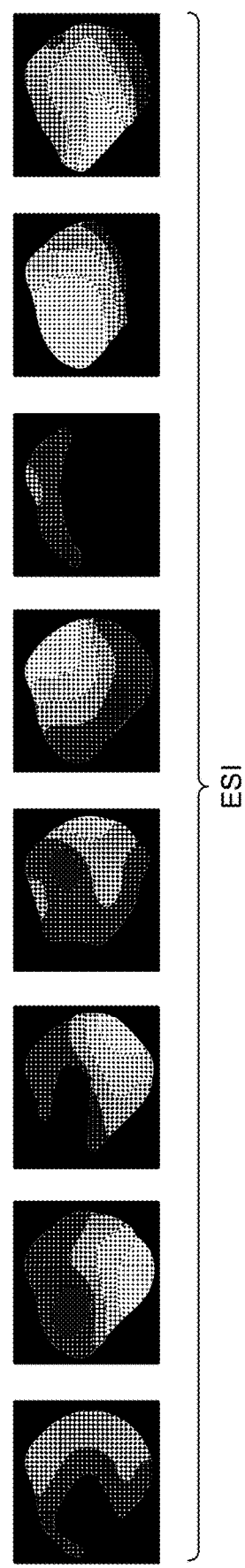
FIG. 4 illustrates exemplary sensitivity-estimate intensity images according to an embodiment.

FIG. 4 depicts exemplary sensitivity-estimate intensity images ESI. The identifying function 35 performs singular value decomposition of each sensitivity-estimate intensity image ESI to identify the first identified coil, the second identified coil, and the third identified coil in descending order of signal values according to the results of the singular value decomposition.

Step S203

The processing circuitry 131 uses the acquisition function 33 to generate a first coil sensitivity map DA3 from the estimation sensitivity maps DA2 with reference to an estimation sensitivity map for a given coil. Specifically, the acquisition function 33 shifts phase images of the multiple coils in phase, with reference to a phase image (hereinafter, first phase image) in the estimation sensitivity map for the first identified coil (Pr3). In this manner the acquisition function 33 generates the first coil sensitivity map DA3.

Figure 5:
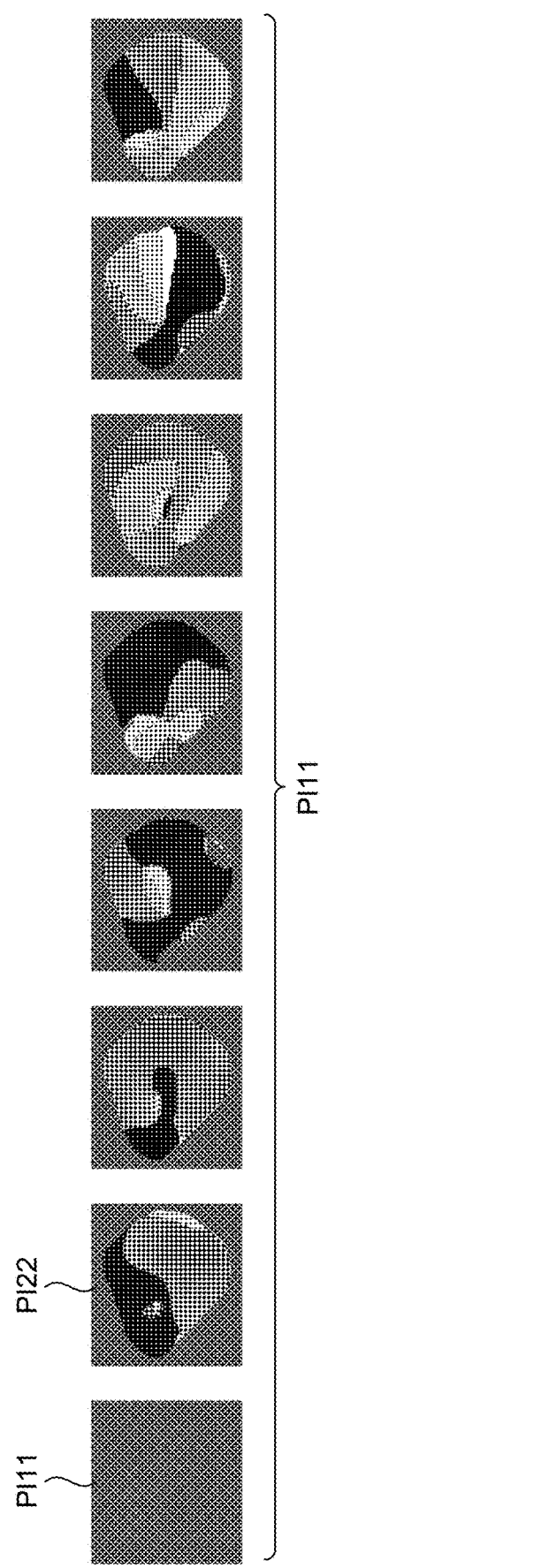
FIG. 5 illustrates phase images in a first coil sensitivity map according to an embodiment, by way of example.

FIG. 5 depicts exemplary phase images PI11 in the first coil sensitivity map DA3. As illustrated in FIG. 5, a first phase image PI11 exhibits uniform values as a result of the phase shift. In other words, the phase images in the estimation sensitivity maps are shifted in phase so that the phase image PI11 corresponding to the first identified coil can be uniform in value.

Step S204

Figure 6:
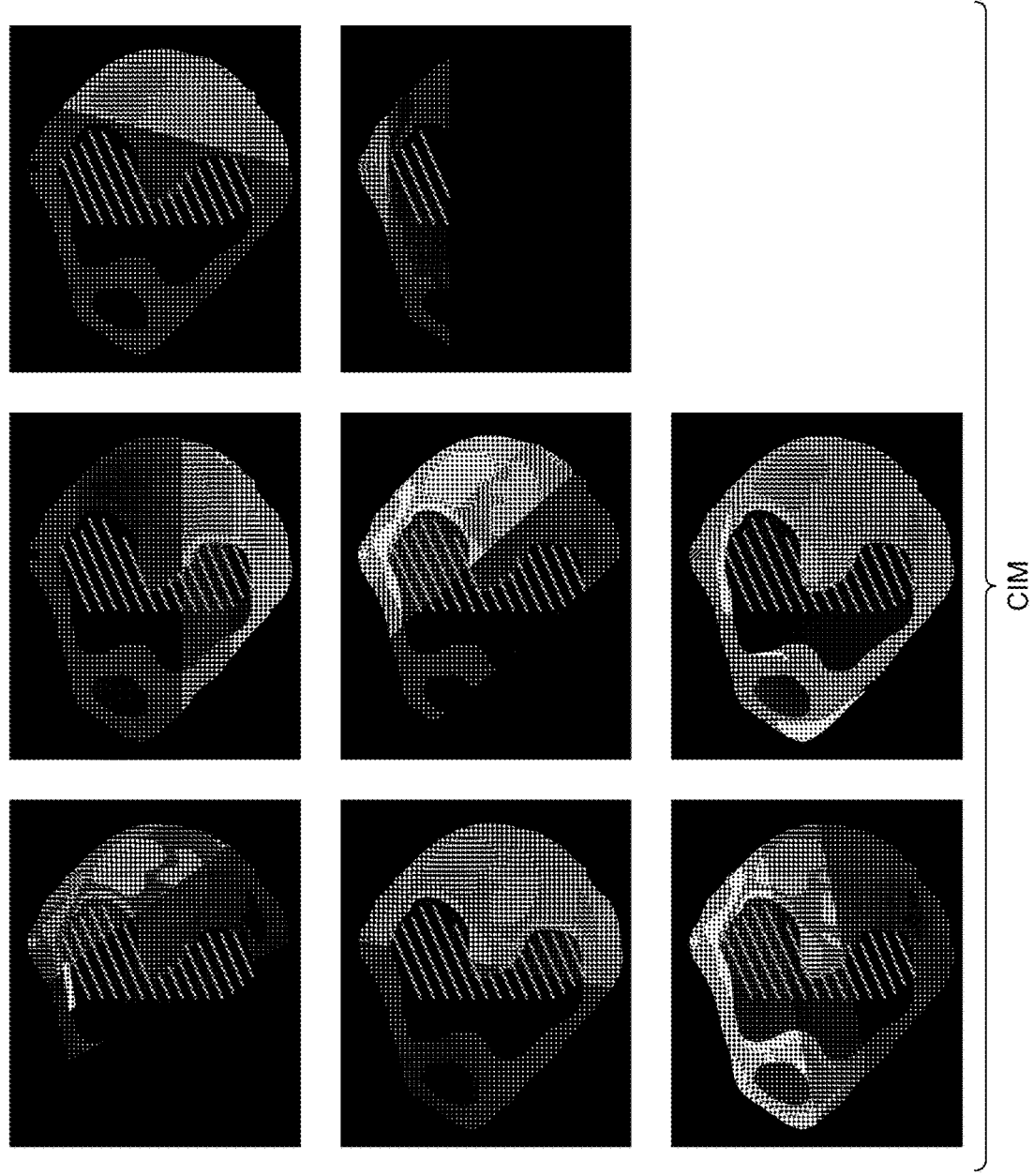
FIG. 6 illustrates intensity images in multiple coil images according to an embodiment.
Figure 7:
FIG. 7 illustrates phase images in multiple coil images according to an embodiment.

The processing circuitry 131 uses the generation function 37 to reconstruct the coil images DA4 corresponding to the multiple coils from the MR data DA1 (Pr4). FIG. 6 depicts exemplary intensity images CIM in the coil images DA4. As illustrated in FIG. 6, the intensity images in the coil images DA4 include wraparound artifacts due to undersampling imaging. FIG. 7 depicts exemplary phase images CIP in the coil images DA4. The coil images DA4 as illustrated in FIG. 6 and FIG. 7 are used in generation of a first image DA5. The operation in S204 may be performed in any stage after step S201.

Step S205

Figure 8:
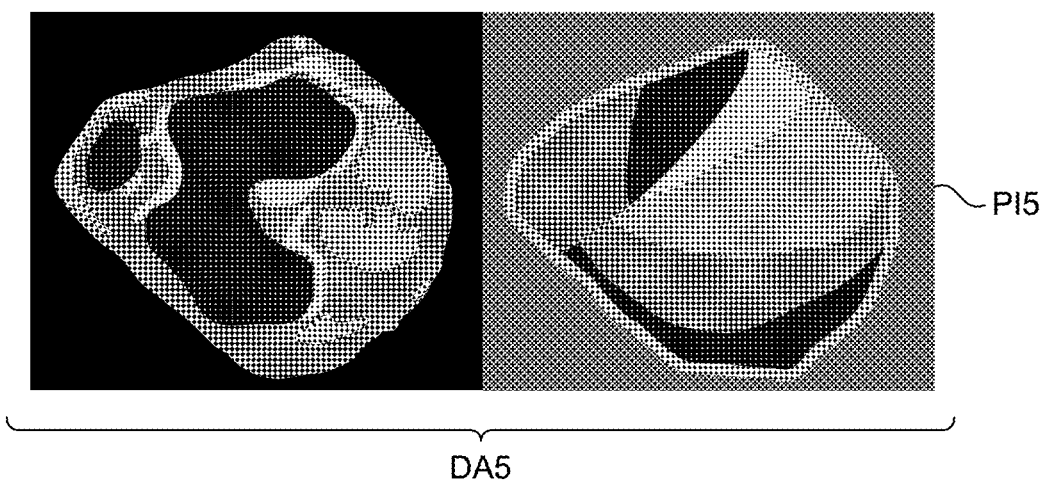
FIG. 8 illustrates an exemplary first image according to an embodiment.

The processing circuitry 131 uses the generation function 37 to generate the first image DA5 based on the coil images DA4 and the first coil sensitivity map DA3. Specifically, the generation function 37 performs a complex expansion such as a fast iterative shrinkage-thresholding algorithm (FISTA) using the coil images DA4 and the first coil sensitivity map DA3 (Pr5). In this manner the generation function 37 generates the first image (DA5). FIG. 8 depicts an exemplary first image DA5. As illustrated in FIG. 8, the first image DA5 is free from wraparound artifacts.

Step S206

Figure 9:
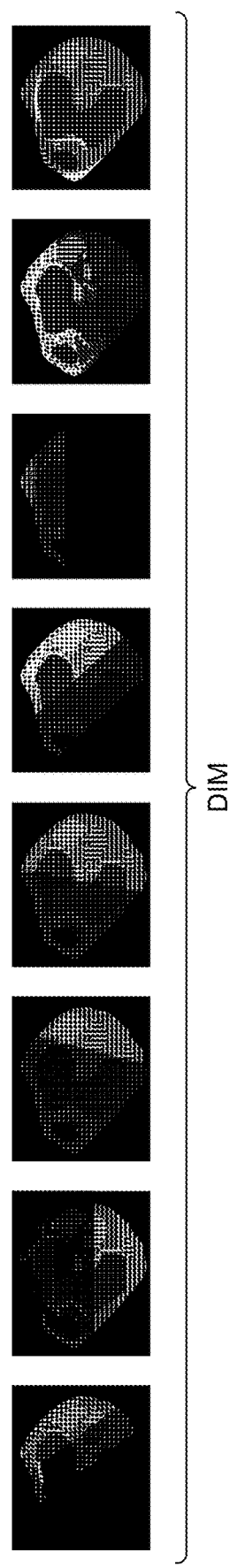
FIG. 9 illustrates intensity images in decomposed images corresponding to multiple coils according to an embodiment, by way of example.
Figure 10:
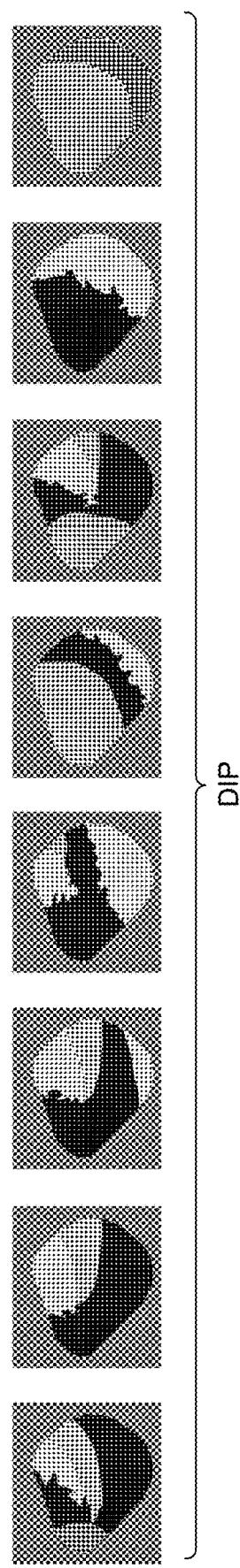
FIG. 10 illustrates phase images in decomposed images corresponding to multiple coils according to an embodiment, by way of example.

The processing circuitry 131 uses the generation function 37 to decompose the first image DA5 based on the first coil sensitivity map DA3 (Pr6). Thereby, the generation function 37 generates multiple decomposed images DA6 corresponding to the multiple coils. FIG. 9 depicts exemplary intensity images DIM in the decomposed images DA6 corresponding to the multiple coils. The intensity images DIM shown in FIG. 9 exhibit less wraparound artifacts than the intensity images CIM shown in FIG. 6. FIG. 10 depicts exemplary phase images DIP in the decomposed images DA6 corresponding to the multiple coils. The decomposed images DA6 shown in FIG. 9 and FIG. 10 are used in the generation of the second image.

Step S207

The processing circuitry 131 uses the generation function 37 to generate a second coil sensitivity map DA7 from the first coil sensitivity map DA3. The second coil sensitivity map DA7 differs in phase from the first coil sensitivity map DA3. Specifically, the generation function 37 shifts phase images corresponding to the multiple coils in phase with reference to a phase image (hereinafter, a second phase image) PI22 corresponding to the second identified coil in the first coil sensitivity map DA3 (Pr7). Thereby, the generation function 37 generates the second coil sensitivity map DA7.

Figure 11:
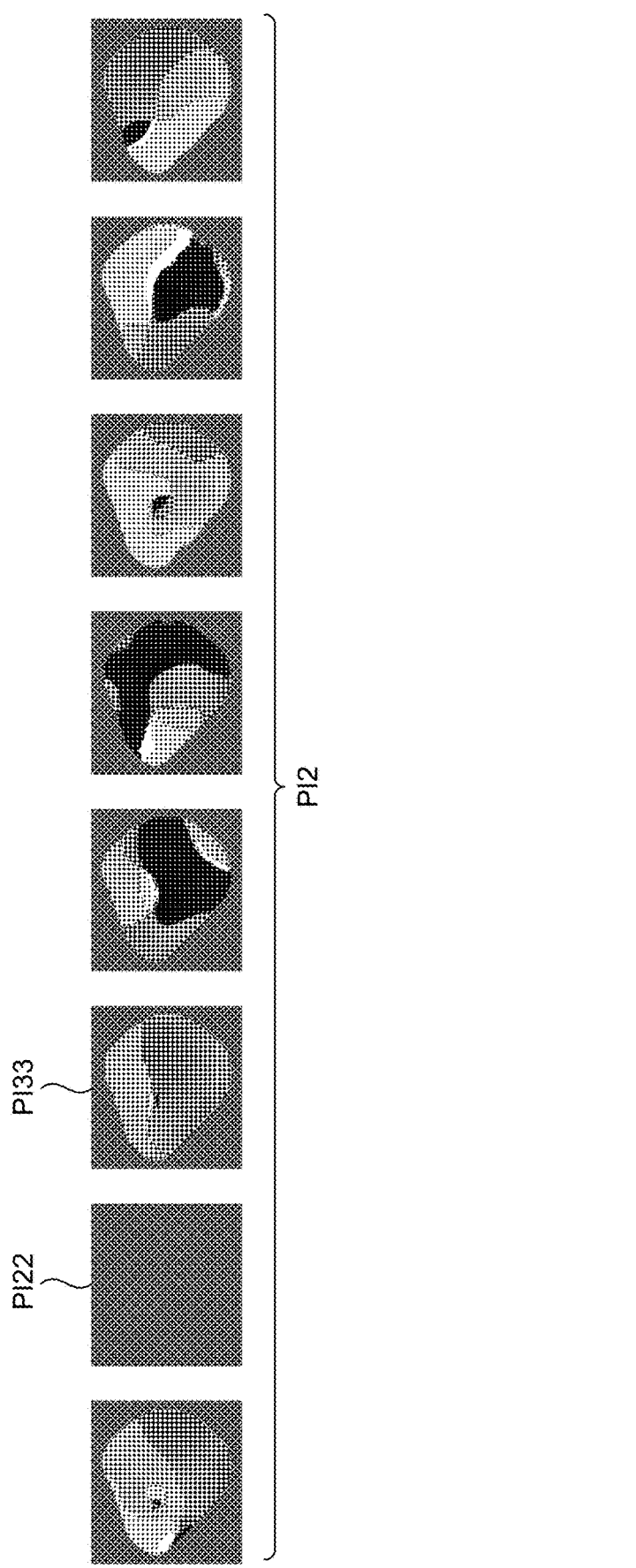
FIG. 11 illustrates phase images in a second coil sensitivity map according to an embodiment, by way of example.

FIG. 11 depicts exemplary phase images PI2 in the second coil sensitivity map DA7. As illustrated in FIG. 11, the second phase image PI22 of FIG. 5 exhibits uniform values as a result of the phase shift. In other words, the phase shift is such that the phase images are shifted in phase in the first coil sensitivity map DA3 so as to allow the phase image PI22 therein to be uniform in value.

The processing circuitry 131 uses the generation function 37 to generate a third coil sensitivity map DA8 from the second coil sensitivity map DA7. The third coil sensitivity map DA8 differs in phase from the first coil sensitivity map DA3 and the second coil sensitivity map DA7. Specifically, the generation function 37 shifts the phase images corresponding to the multiple coils in phase in the second coil sensitivity map DA7 with reference to a phase image (hereinafter, a third phase image) PI33 corresponding to the third identified coil (Pr8). Thereby, the generation function 37 generates the third coil sensitivity map DA8.

Figure 12:
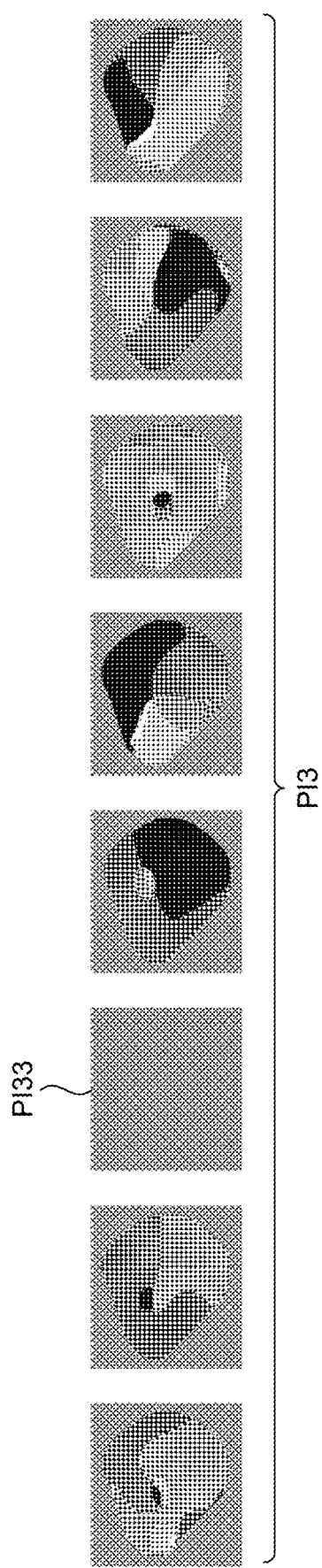
FIG. 12 illustrates phase images in a third coil sensitivity map according to an embodiment, by way of example.

FIG. 12 depicts exemplary phase images PI3 in the third coil sensitivity map DA. As illustrated in FIG. 12, the phase image PI33 of FIG. 11 exhibits uniform values as a result of the phase shift. In other words, the phase shift is such that the phase images are shifted in phase in the second coil sensitivity map DA7 so as to allow the phase image PI33 therein to be uniform in value.

Step S208

The processing circuitry 131 uses the generation function 37 to generate a second image DA9 based on the decomposed images DA6 and the second coil sensitivity map DA7 (Pr9). Specifically, the generation function 37 generates the second image DA9 by performing a coil combination to the decomposed images DA6 based on the second coil sensitivity map DA7.

Figure 13:
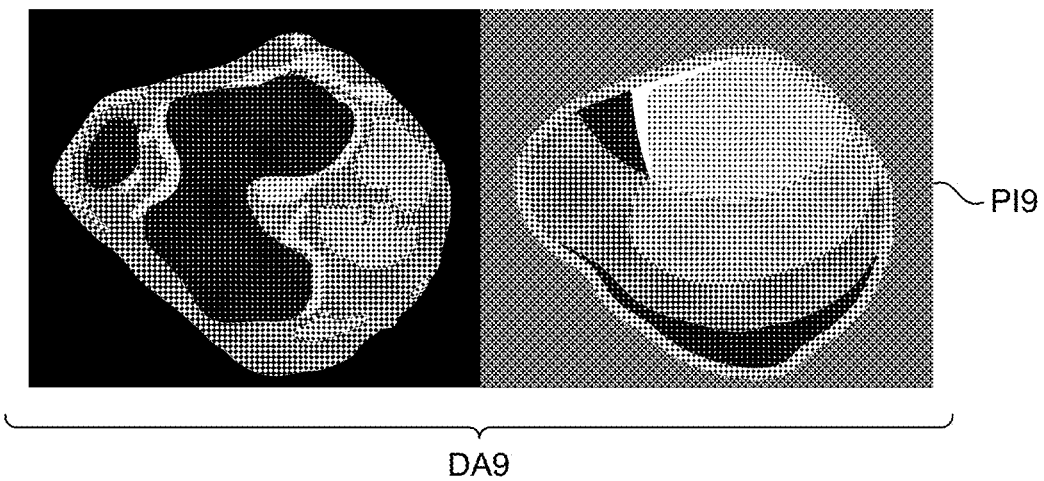
FIG. 13 illustrates an exemplary second image after a coil combination according to an embodiment.

FIG. 13 depicts an exemplary second image DA9 after a coil combination. The differences between the second image DA9 of FIG. 13 and the first image DA5 of FIG. 8 are in that a phase image PI9 of the second image DA9 and a phase image PI5 of the first image DA5 differ from each other due to an effect of the phase shift.

The processing circuitry 131 uses the generation function 37 to generate a third image DA10 based on the decomposed images DA6 and the third coil sensitivity map DA8 (Pr10). Specifically, the generation function 37 generates the third image DA10 by performing a coil combination to the decomposed images DA6 based on the third coil sensitivity map DA8.

Figure 14:
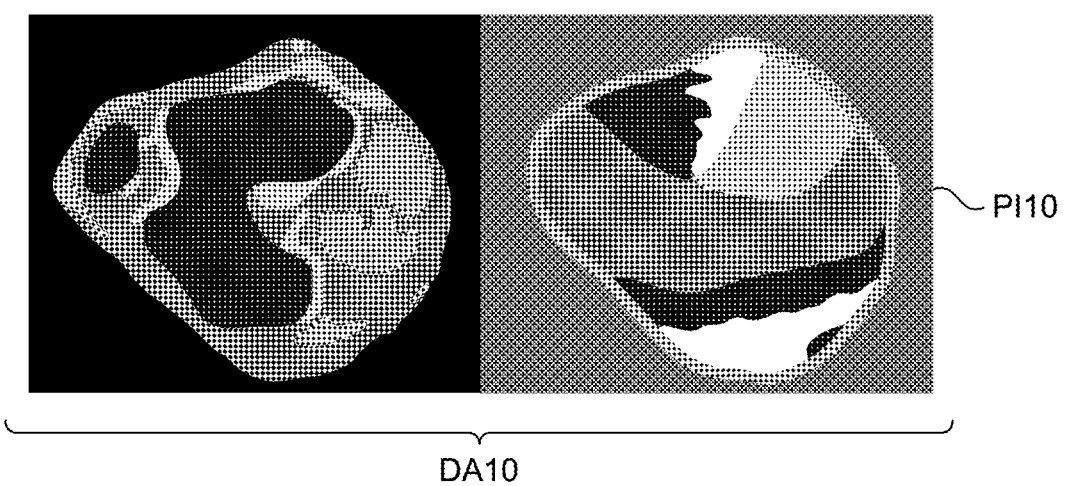
FIG. 14 illustrates an exemplary third image after a coil combination according to an embodiment.

FIG. 14 depicts an exemplary third image DA10 after a coil combination. The differences among the third image DA10 of FIG. 14, the second image DA5 of FIG. 13, and the first image DA5 of FIG. 8 are in that a phase image PI10 of the third image DA10, the phase image PI9 of the second image DA9, and the phase image PI5 of the first image DA5 differ from one another due to an effect of the phase shift.

Step S209

The processing circuitry 131 uses the generation function 37 to perform an interpolation Pr11 on the first image DA5 to generate a first interpolated image DA11. The first interpolated image can be generated in any stage after the first image DA5 is generated.

Figure 15:
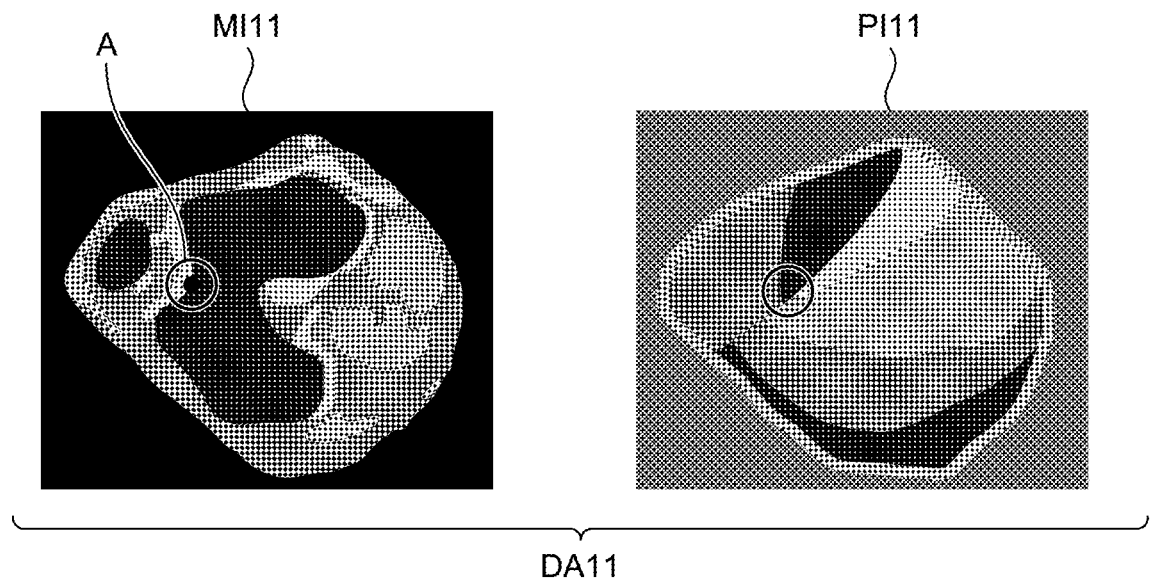
FIG. 15 illustrates an exemplary first interpolated image according to an embodiment.

FIG. 15 depicts an exemplary first interpolated image DA11. As illustrated in FIG. 15, an intensity image MI11 of the first interpolated image DA11 contains an artifact A. The location of the artifact A corresponds to a location where a steep change in phase is occurring (hereinafter, steep phase-changing location) in the phase image PI11 of the first interpolated image DA11, as illustrated in FIG. 15.

The processing circuitry 131 uses the generation function 37 to perform an interpolation Pr12 on the second image DA9 to generate a second interpolated image DA12. The second interpolated image can be generated in any stage after the second image DA9 is generated.

Figure 16:
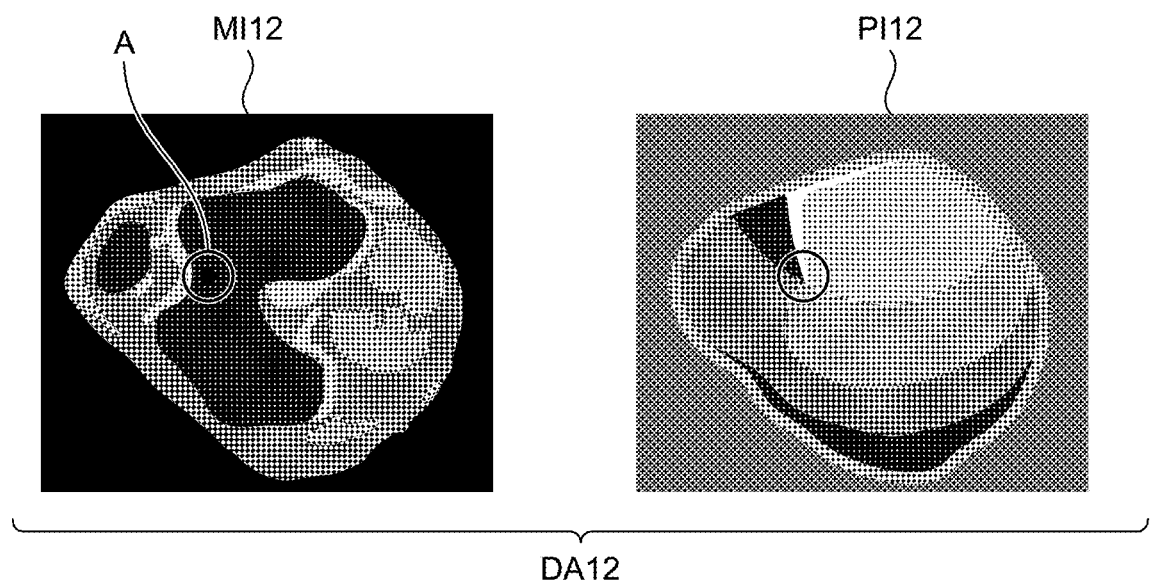
FIG. 16 illustrates an exemplary second interpolated image according to an embodiment.

FIG. 16 depicts an exemplary second interpolated image DA12. As illustrated in FIG. 16, an intensity image MI12 of the second interpolated image DA12 contains an artifact A. The location of the artifact A corresponds to a steep phase-changing location in a phase image PI12 of the second interpolated image DA12, as illustrated in FIG. 16.

The processing circuitry 131 uses the generation function 37 to perform an interpolation Pr13 on the third image DA10 to generate a third interpolated image DA13. The third interpolated image can be generated in any stage after the third image DA10 is generated.

Figure 17:
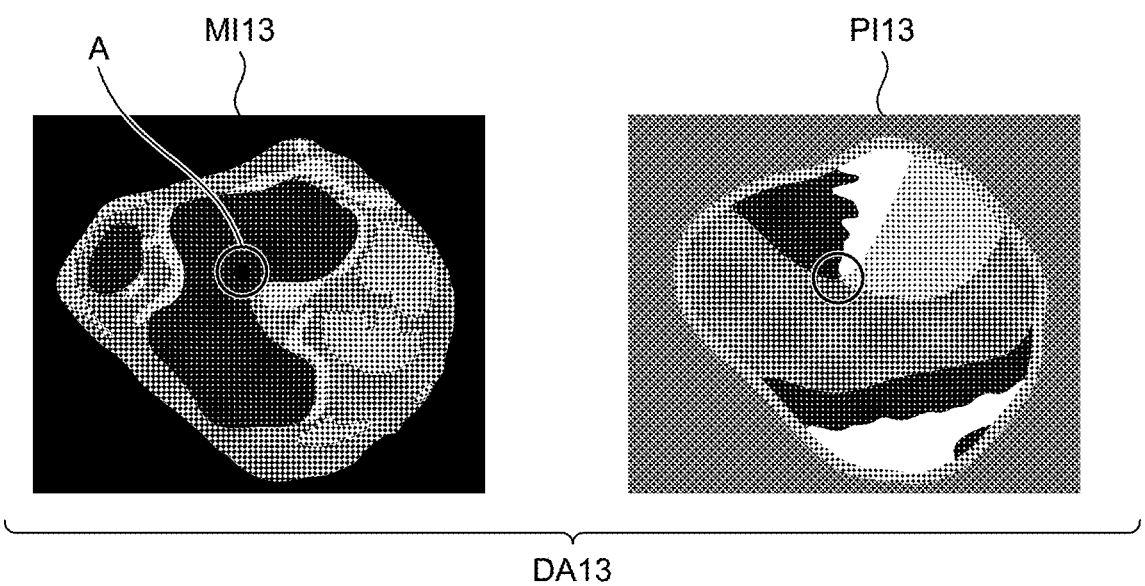
FIG. 17 illustrates an exemplary third interpolated image according to an embodiment.

FIG. 17 depicts an exemplary third interpolated image DA13. As illustrated in FIG. 17, an intensity image MI13 of the third interpolated image DA13 contains an artifact A. The location of the artifact A corresponds to a steep phase-changing location in a phase image PI13 of the third interpolated image DA13, as illustrated in FIG. 17.

As illustrated in FIG. 15 to FIG. 17, the artifact A appears in different locations due to the phase shift effect. Further, the artifact A is more black in color, i.e., smaller in pixel value, than the pixels around the artifact A, as illustrated in FIG. 15 to FIG. 17.

Step S210

The processing circuitry 131 uses the generation function 37 to perform a statistical process on the first interpolated image DA11, the second interpolated image DA12, and the third interpolated image DA13 (Pr14). Thereby, the generation function 37 generates a final image DA14. Specifically, the generation function 37 selects a maximum value or a median among three pixel values at the same pixel positions in the intensity image MI11 of the interpolated image DA11, the intensity image MI12 of the second interpolated image DA12, and the intensity image MI13 of the third interpolated image DA13. The generation function 37 performs such a selection of pixel values with respect to all the pixels of the intensity images MI11 to MI13 to generate the final image DA14 using the selected pixel values. By this selection method, the pixel values of the artifact A are unselected.

Figure 18:
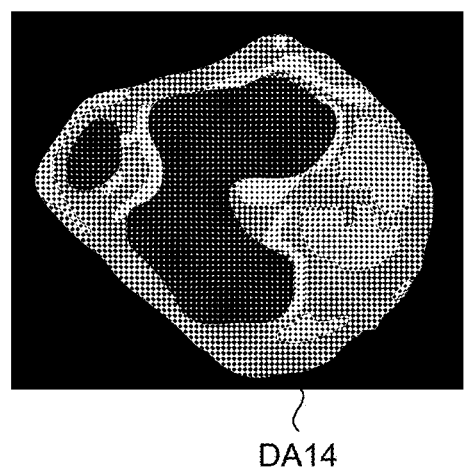
FIG. 18 illustrates an exemplary final image according to an embodiment.

FIG. 18 depicts an exemplary final image DA14. As illustrated in FIG. 18, the final image DA14 is free from the artifacts A which appear in the intensity image MI11 of FIG. 15, the intensity image MI12 of FIG. 16, and the intensity image MI13 of FIG. 17.

The system control circuitry 123 displays the final image DA14 on the display 129. The system control circuitry 123 also stores the final image DA14 in the memory 125. This completes the image generation process.

According to the embodiments as above, the MRI apparatus 100 acquires, for the multiple coils, the first coil sensitivity map DA3 and the second coil sensitivity map DA7 different in phase from the first coil sensitivity map DA3. The MRI apparatus 100 generates the first image DA5 based on the first coil sensitivity map DA3 and the MR data DA1 related to the multiple coils, generates the second image DA9 based on the second coil sensitivity map DA7, the first coil sensitivity map DA3, and the first image DA5, and generates the final image DA14 from the first image DA5 and the second image DA9.

Specifically, the MRI apparatus 100 performs the interpolation Pr11 on the first image DA5 to generate the first interpolated image DA11, performs the interpolation Pr12 on the second image DA9 to generate the second interpolated image DA12, and generates the final image DA14 from the first interpolated image DA11 and the second interpolated image DA12. More specifically, the MRI apparatus 100 generates the final image DA14 by performing the statistical process Pr14 on the first interpolated image DA11 and the second interpolated image DA12. As an example, the MRI apparatus 100 generates the final image DA14 by the statistical process Pr14 including computing a mean of two pixel values at two corresponding pixels in the first interpolated image DA11 and the second interpolated image DA12 or selecting a larger value or a median of the two pixel values.

The MRI apparatus 100 further acquires, for the multiple coils, an odd number of coil sensitivity maps (for example, the third coil sensitivity map DA8) different in phase from the first coil sensitivity map DA3 and the second coil sensitivity map DA7. The MRI apparatus 100 generates an odd number of images (for example, the third image DA10) based on the odd number of coil sensitivity maps, the first coil sensitivity map DA3, and the first image DA5. The MRI apparatus 100 then selects a median among an odd number of pixel values at an odd number of corresponding pixels in the first image DA5, the second image DA9, and the odd number of images to generate the final image DA14 from the first image DA5, the second image DA9, and the odd number of images.

Moreover, the MRI apparatus 100 estimates the sensitivity maps DA2 for the multiple coils from the undersampled MR data DA1 to acquire the first coil sensitivity map DA3 from the estimation sensitivity maps DA2.

As such, the MRI apparatus 100 according to the embodiments can move the location of the artifact A in the phase images corresponding to different phase shifts after the coil combination, by shifting the phase in the sensitivity maps. Because of this, the MRI apparatus 100 can generate the final image DA14 while avoiding the steep phase-changing location where the artifact A may occur.

Consequently, the MRI apparatus 100 can reduce or effectively remove the artifact A to generate the final image DA14 with higher resolution, for example. Thus, the MRI apparatus 100 can provide the final image DA14 with improved image quality and improve examination and diagnosis efficiency with respect to the subject P. In some modifications of the embodiments, the processing by the identifying function 35 may be omissible. Such modifications can attain similar or same effects as the embodiments.

In addition, the MRI apparatus 100 acquires the first coil sensitivity map DA3 and the second coil sensitivity map DA7 by shifting the phase images of the multi-coil sensitivities in phase with reference to the sensitivity of one of the multiple coils. For this purpose, the MRI apparatus 100 identifies a single coil to be the reference for phase shift, based on the intensity images in the estimation sensitivity maps corresponding to the multiple coils or the intensity images in the coil images reconstructed from the MR data.

As such, the MRI apparatus 100 according to the embodiments can generate the final image DA14 using, for example, the first image DA5, the second image DA9, and the third image DA10 in the order of magnitude of phase shift effects without phase shifting with respect to all the coils to generate the coil sensitivity maps. Thereby, the MRI apparatus 100 can efficiently move the steep phase-changing location while lowering computational costs for the image generation process. Thus, the MRI apparatus 100 can reduce various expenses pertaining to the computational costs and shorten the length of computation time. Consequently, the MRI apparatus 100 can provide the final image DA14 with improved image quality and further improve examination and diagnosis efficiency with respect to the subject P.

To implement the technical ideas of some embodiments by an image generation method, the image generation method includes acquiring the first coil sensitivity map DA3 and the second coil sensitivity map DA7 for the multiple coils, the second coil sensitivity map being different in phase from the first coil sensitivity map; generating the first image DA5 based on the first coil sensitivity map DA3 and the magnetic resonance data DA1 related to the multiple coils; generating the second image DA9 based on the first coil sensitivity map DA3, the second coil sensitivity map DA7, and the first image DA5; and generating the final image DA14 from the first image DA5 and the second image DA9. The procedures and effects of the image generation process by the image generation method are similar or the same as those in the embodiments, therefore, a description there of is omitted.

To implement the technical ideas of some embodiments by an image generation program, the image generation program causes a computer to execute acquiring the first coil sensitivity map DA3 and the second coil sensitivity map DA7 for the multiple coils, the second coil sensitivity map being different in phase from the first coil sensitivity map; generating the first image DA5 based on the first coil sensitivity map DA3 and the magnetic resonance data DA1 related to the multiple coils; generating the second image DA9 based on the first coil sensitivity map DA3, the second coil sensitivity map DA7, and the first image DA5; and generating the final image DA14 from the first image DA5 and the second image DA9.

As an example, the image generation program may be installed in a computer included in a modality such as the MRI apparatus 100 or a PACS server, and loaded on the memory to implement the image generation process. In this case the program for causing the computer to execute the image generation process can be stored in a storage medium such as a magnetic disk (e.g., hard disk), an optical disk (e.g., CD-ROM, DVD), or a semiconductor memory for distribution. The procedures and effects of the image generation process by the image generation program are similar or the same as those in the embodiments, therefore, a description there of is omitted.

According to at least one of the embodiments, it is possible to reduce artifacts arising from a steep change in phase.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising processing circuitry configured to:
    acquire a first coil sensitivity map and a second coil sensitivity map for a plurality of coils, the second coil sensitivity map being different in phase from the first coil sensitivity map;
    generate a first image based on the first coil sensitivity map and magnetic resonance data related to the plurality of coils;
    generate a second image based on the first coil sensitivity map, the second coil sensitivity map, and the first image; and
    generate a final image from the first image and the second image.

2. The magnetic resonance imaging apparatus according to claim 1, wherein the processing circuitry is further configured to:
    perform an interpolation on the first image to generate a first interpolated image, and
    perform an interpolation on the second image to generate a second interpolated image.

3. The magnetic resonance imaging apparatus according to claim 2, wherein
    the processing circuitry is further configured to perform a statistical process on the first interpolated image and the second interpolated image to generate the final image.

4. The magnetic resonance imaging apparatus according to claim 3, wherein
    the processing circuitry is further configured to generate the final image by the statistical process including computing a mean of two pixel values at two corresponding pixels in the first interpolated image and the second interpolated image or selecting a larger value or a median of the two pixel values.

5. The magnetic resonance imaging apparatus according to claim 1, wherein the processing circuitry is further configured to:
    acquire an odd number of coil sensitivity maps for the plurality of coils, the odd number of coil sensitivity maps being different in phase from the first coil sensitivity map and the second coil sensitivity map,
    generate an odd number of images based on the odd number coil sensitivity maps, the first coil sensitivity map, and the first image, and
    generate the final image from the first image, the second image, and the odd number of images by selecting a median among an odd number of pixel values at an odd number of corresponding pixels in the first image, the second image, and the odd number of images.

6. The magnetic resonance imaging apparatus according to claim 1, wherein
    the processing circuitry is further configured to estimate a sensitivity map for the plurality of coils from under-sampled magnetic resonance data, and acquire the first coil sensitivity map based on the estimated sensitivity map.

7. The magnetic resonance imaging apparatus according to claim 1, wherein
    the processing circuitry is further configured to acquire the first coil sensitivity map and the second coil sensitivity map by changing, in phase, phase images of sensitivities of the plurality of coils with reference to a sensitivity of one of the plurality of coils.

8. The magnetic resonance imaging apparatus according to claim 7, wherein
    the processing circuitry is further configured to identify the one of the plurality of coils to be a reference for a phase change, based on intensity images in a plurality of sensitivity maps for the plurality of coils or intensity images reconstructed from the magnetic resonance data.

9. An image generation method, comprising:
    acquiring a first coil sensitivity map and a second coil sensitivity map for a plurality of coils, the second coil sensitivity map being different in phase from the first coil sensitivity map;
    generating a first image based on the first coil sensitivity map and magnetic resonance data related to the plurality of coils;
    generating a second image based on the first coil sensitivity map, the second coil sensitivity map, and the first image; and
    generating a final image from the first image and the second image.

10. A computer-readable nonvolatile storage medium storing an image generation program for causing a computer to execute:
    acquiring a first coil sensitivity map and a second coil sensitivity map for a plurality of coils, the second coil sensitivity map being different in phase from the first coil sensitivity map;
    generating a first image based on the first coil sensitivity map and magnetic resonance data related to the plurality of coils;
    generating a second image based on the first coil sensitivity map, the second coil sensitivity map, and the first image; and
    generating a final image from the first image and the second image.

* * * * *